(12) United States Patent
Fenouillet-Beranger et al.

(10) Patent No.: US 10,930,562 B2
(45) Date of Patent: Feb. 23, 2021

(54) INTERNAL VIA WITH IMPROVED CONTACT FOR UPPER SEMI-CONDUCTOR LAYER OF A 3D CIRCUIT

(71) Applicant: COMMISSARIAT A L'ENERGIE ATOMIQUE ET AUX ENERGIES ALTERNATIVES, Paris (FR)

(72) Inventors: Claire Fenouillet-Beranger, Grenoble (FR); Fabrice Nemouchi, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/422,391

(22) Filed: May 24, 2019

(65) Prior Publication Data

US 2019/0371671 A1 Dec. 5, 2019

(30) Foreign Application Priority Data

May 29, 2018 (FR) ...................................... 18 54576

(51) Int. Cl.
*H01L 21/822* (2006.01)
*H01L 21/768* (2006.01)
*H01L 23/535* (2006.01)
*H01L 27/06* (2006.01)
(Continued)

(52) U.S. Cl.
CPC .... *H01L 21/8221* (2013.01); *H01L 21/28518* (2013.01); *H01L 21/76805* (2013.01); *H01L 21/76889* (2013.01); *H01L 21/76895* (2013.01); *H01L 21/76898* (2013.01); *H01L 21/823475* (2013.01); *H01L 23/535* (2013.01); *H01L 27/0688* (2013.01)

(58) Field of Classification Search
CPC ............. H01L 21/8221; H01L 27/0688; H01L 23/535; H01L 21/76895; H01L 21/76889; H01L 21/76805; H01L 21/28518; H01L 21/76898; H01L 21/823475
See application file for complete search history.

(56) References Cited

U.S. PATENT DOCUMENTS

| 2005/0121789 | A1 | 6/2005 | Madurawe |
| 2006/0234487 | A1 | 10/2006 | Kim et al. |
| 2008/0185648 | A1 | 8/2008 | Jeong et al. |

(Continued)

FOREIGN PATENT DOCUMENTS

JP 2012-64657 3/2012

OTHER PUBLICATIONS

Preliminary French Search Report dated Feb. 28, 2019 in French Application 18 54576 filed on May 29, 2018 (with English Translation of Categories of Cited Documents).

(Continued)

*Primary Examiner* — Ahmed N Sefer
(74) *Attorney, Agent, or Firm* — Oblon, McClelland, Maier & Neustadt, L.L.P.

(57) ABSTRACT

A connection structure for microelectronic device with superposed semi-conductor layers including a conductor via that connects a lower face of an upper semi-conductor layer and an underlying conducting zone, the connection structure further including a silicide zone in contact with a lower face or with an inner face of the layer of the upper semi-conductor layer.

20 Claims, 11 Drawing Sheets

(51) Int. Cl.
    *H01L 21/8234*    (2006.01)
    *H01L 21/285*     (2006.01)

(56) References Cited

U.S. PATENT DOCUMENTS

| | | |
|---|---|---|
| 2012/0068179 A1 | 3/2012 | Ishida et al. |
| 2016/0035702 A1* | 2/2016 | Luo .................. H01L 21/28518 257/754 |
| 2016/0111330 A1* | 4/2016 | Fenouillet-Beranger .................... H01L 21/324 438/637 |
| 2017/0117186 A1* | 4/2017 | Fenouillet-Beranger .................... H01L 21/76847 |
| 2018/0151497 A1* | 5/2018 | Makala ............. H01L 27/11556 |

OTHER PUBLICATIONS

U.S. Appl. No. 15/234,240, filed Aug. 11, 2016, 2017/0062424 A1, Rodriguez, P., et al.
U.S. Appl. No. 15/967,778, filed May 1, 2018, 2018/0331108 A1, Hutin, L., et al.
U.S. Appl. No. 15/949,566, filed Apr. 10, 2018, 2018/0301479 A1, Robin, I., et al.
U.S. Appl. No. 16/159,923, filed Oct. 15, 2018, 2019/0123138 A1, Hutin, L., et al.
U.S. Appl. No. 16/196,390, filed Nov. 20, 2018, Andrieu, F., et al.
U.S. Appl. No. 16/284,103, filed Feb. 25, 2019, Hutin, L., et al.

* cited by examiner

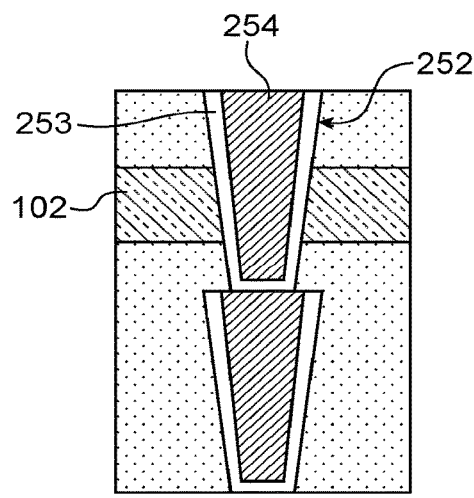
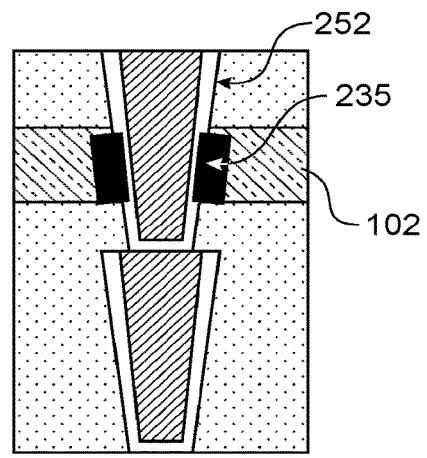
FIG.6A  FIG.6B
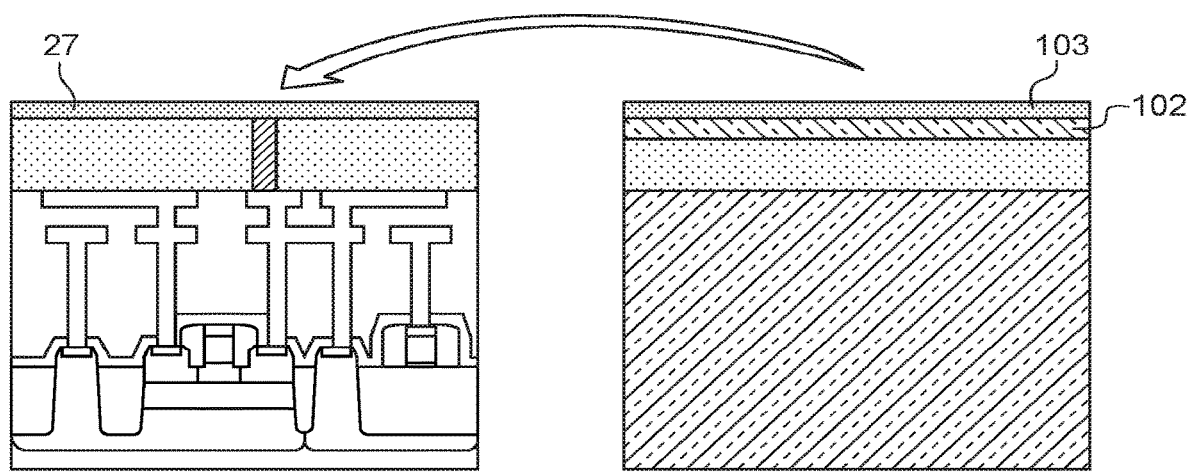
FIG.7

INTERNAL VIA WITH IMPROVED CONTACT FOR UPPER SEMI-CONDUCTOR LAYER OF A 3D CIRCUIT

TECHNICAL FIELD AND PRIOR ART

This application relates to the field of integrated circuits provided with components distributed over several levels or stages of electronic components.

Such devices are generally qualified as three-dimensional or "3D" integrated circuits and typically comprise at least one first semi-conductor layer referred to as "lower" and at least one second semi-conductor layer referred to as "upper", with the second semi-conductor layer being arranged above the first semi-conductor layer and separated from the first semi-conductor layer by at least one insulating layer.

In a device with transistors $T_1$, $T_2$ distributed over several levels, in order to establish a connection between a transistor $T_2$ of an upper level and a conducting zone located under this upper level, typically in the form of a metal line 8, a connection structure such as in FIG. 9 can be provided.

This connection structure is formed from a vertical pad 5 in contact with the active zone 4 of the transistor $T_2$, from a horizontal metal line 6 connected to the vertical pad 5, and from a vertical metal via 7 connected to the horizontal metal line 6, with the metal via being in contact with the metal line 8 to be connected.

Such an arrangement of a connection structure can give rise to problems concerning space.

The document from Liu et al, "Ultra-High Density 3D SRAM Cell Designs for Monolithic 3D Integrations" Interconnect Technology Conference (IITC), 2012 IEEE International, proposes a more compact connection structure formed from a metal internal via in contact with the active zone of a higher level transistor of a 3D circuit and which extends under this active zone.

Such a connection structure gives rise to integration difficulties and comprises high access resistance with the active zone of the transistor.

There is the problem of carrying out a new improved connection structure with regards to one or the other of the disadvantages mentioned hereinabove.

DISCLOSURE OF THE INVENTION

An embodiment of this invention provides for a connection structure for a microelectronic device having several levels of semi-conductor layers arranged one above the other, with the device having at least one lower semi-conductor layer as well as at least one upper semi-conductor layer, above the lower semi-conductor layer, an insulating layer wherein extends at least one conducting zone being arranged between the upper semi-conductor layer and the lower semi-conductor layer, the connection structure comprising a conductor via that connects a lower face of the upper semi-conductor layer and the conducting zone, said connection structure further comprising, in the extension of the conductor via, a compound zone of metal and semi-conductor in contact with a lower face or in contact with an inner face and extending through the layer of the upper semi-conductor layer.

Such a compound zone makes it possible to reduce the access resistance to the active zone, in particular in a source or drain region of the transistor.

The term "active zone" means a zone of a semi-conductor layer wherein at least one source region, a channel region, and a drain region of a transistor extend.

According to another aspect, an embodiment of this invention provides a method for carrying out a connection structure comprising a conductor via and a contact zone with a metal and semi-conductor compound in the extension of said conductor via, the connection structure extending between an active zone of a higher level transistor of a microelectronic device comprising several levels of semi-conductor layers arranged one above the other and at least one conducting zone located under the upper level, the method comprising:

a) supplying a lower stage provided with at least one first electronic component arranged at least partially in a lower semi-conductor layer resting on a substrate, the electronic component being surmounted by at least one insulating layer and by said conducting zone, then, b) transferring onto the lower stage an upper semi-conductor layer, then, c) carrying out at least partially a transistor of which the active zone extends in the upper semi-conductor layer and at least one metal region in contact with said active zone, d) carrying out at least one thermal annealing in such a way as to form from said metal region, said contact zone with a metal and semi-conductor compound base and in contact with said active zone, said contact zone being located in the extension of a conductor via formed before and/or after the transferring, said conductor via extending under the active zone and being arranged in contact with said conducting zone.

According to a first possibility of implementing the method, wherein the producing of the conductor via comprises, prior to the step b) of transferring: the formation through the insulating layer of a conducting element in contact with said conducting zone and of said metal region in the extension of this conducting element, said metal region being flush on an upper face of the insulating layer, the transferring in the step b) can then be carried out in such a way that said metal region is put into contact with a lower face of the upper semi-conductor layer.

Advantageously, the formation of the conducting element and of said metal region in its extension comprises:

forming the conducting element passing through the insulating layer, removing an upper portion of the conducting element, in such a way as to release a hole in the insulating layer, filling said hole with at least one metal material is such a way as to produce said metal region.

Advantageously, once the hole is formed and prior to filling said hole a step of cleaning can be provided. Such a step carried out wet, for example using HF, and/or by plasma, can in particular makes it possible to prevent having intermediate oxidised zones between the conducting element and the metal material for filling.

According to a second possibility of implementing the method the producing of the conductor via can include, after the step b) of adding:

forming of at least one opening passing through the upper semi-conductor layer, depositing of metal material in said opening in such a way as to form the metal region.

Advantageously, prior to the filling of the opening a step of cleaning and in particular of the semi-conductor layer can be provided. Such a step carried out wet and/or by plasma, can in particular makes it possible to prevent having intermediate oxidised zones between the semi-conductor layer and the metal region.

Advantageously, the producing of the conductor via can include, prior to the step b) of transferring: the formation through the insulating layer of a conducting element in contact with said conducting zone then with said metal region in the extension of this conducting element, the adding in the step b) can then be carried out in such a way that an insulating thickness is retained above an upper end of said conducting element, said opening passing through the upper semi-conductor layer being formed in such a way as to furthermore pass through said insulating thickness and to expose said upper end of said conducting element.

Advantageously, in the step b) of transferring, the upper semi-conductor layer can be coated with a first layer of dielectric material, and said lower stage can also be coated with a second layer of dielectric material, the transferring being carried out by molecular bonding of the first layer of dielectric material on the second layer of dielectric material.

According to a particular embodiment of the conductor via: after the production of said opening and the step d) of forming said contact zone with a metal and semi-conductor compound, a metal pad is formed in said opening.

Alternatively, the producing of the conductor via can include, after the production of said opening, the production of a metal pad in this opening, said metal region being a region of said metal pad in contact with the upper semi-conductor layer.

Advantageously, when at least one metal zone is further formed on an upper face of the active zone of the transistor, the annealing carried out in the step d) an be carried out in such a way as to form concomitantly with the forming of said contact zone with a metal and semi-conductor compound, a compound region of metal and semi-conductor in the extension of said metal zone.

Advantageously, when the source and drain regions of said transistor are doped in the step c), with the thermal annealing in the step d) can be provided in such a way as to produce a concomitant activation of doping agents of the source and drain regions.

The thermal annealing carried out in the step d) can be advantageously a high-temperature annealing and of very short duration, typically carried out using a laser, and in particular a nanosecond laser with pulses that can have a duration of about ten nanoseconds.

According to a possibility of implementing the method, said metal region can be in contact with another active zone of another transistor, in such a way that said contact zone formed in the step d) with a metal and semi-conductor compound base is in contact with said other active zone.

According to a particular embodiment, when the upper semi-conductor layer is made of silicon the metal region can have a cobalt and/or Ti and/or Ni base.

BRIEF DESCRIPTION OF THE DRAWINGS

This invention shall be better understood when reading the description of embodiments provided, purely for the purposes of information and in no way limiting, in reference to the accompanying drawings wherein:

FIGS. 6A-6B are used to show a via structure before and after the forming of the contact zone made of silicide around this via;

FIG. 7 is used to show an alternative embodiment with a step of transferring a semi-conductor layer on a lower stage by direct molecular bonding of dielectric layers;

Identical, similar or equivalent portions of the various figures bear the same numerical references so as to facilitate passing from one figure to another.

The various portions shown in the figures are not necessarily shown to a uniform scale, in order to make the figures more legible.

Furthermore, in the description hereinafter, terms that depend on the orientation, such as "vertical", "lateral", "upper", "lower", etc. of a structure apply by considering that the structure is oriented in the manner shown in the figures.

DETAILED DESCRIPTION OF PARTICULAR EMBODIMENTS

Figure 1A:
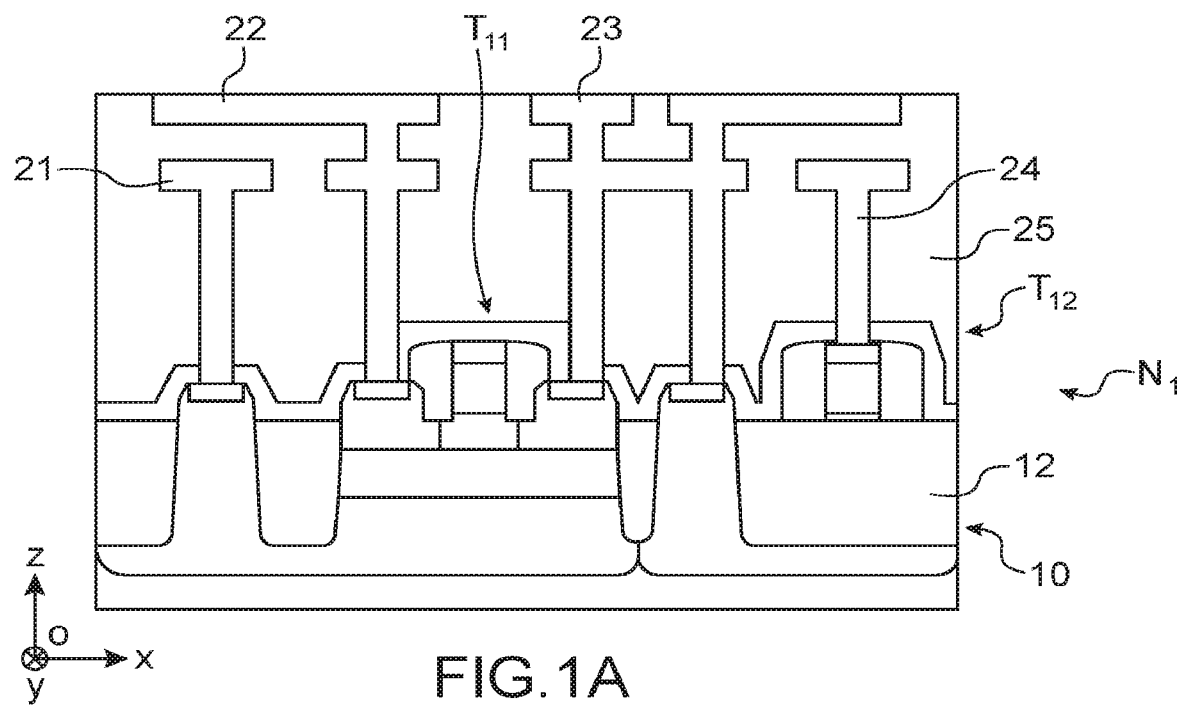
FIGS. 1A-1J are used to show an embodiment of a connection structure between a 3D circuit transistor and an underlying conducting zone, through an inner via and a contact zone made of silicide formed at the end of the via and in contact with the active zone of the upper transistor.

Reference is now made to FIG. 1A that gives a possible starting device for implementing a method for producing a connection structure in a 3D circuit comprising several semi-conductor layers arranged one above the other.

The connection structure that is produced here comprises a contact zone with a metal and semi-conductor compound, in particular a silicide contact zone, formed in this example under an active zone of a higher level transistor, in other words under a semi-conductor layer wherein this higher level transistor is at least partially carried out.

The starting device can be carried out using a substrate that comprises a first superficial semi-conductor layer 12 wherein one or several electronic components of a first level $N_1$ of electronic components are provided. In the example shown in FIG. 1A, the electronic components are transistors $T_{11}$ and $T_{12}$, and have respective channel regions that extend in the first semi-conductor layer 12. The transistors $T_{11}$, $T_{12}$ can be implemented on a bulk substrate 10 or on a substrate of the semi-conductor on insulator type, in particular a substrate of the SOI (Silicon On Insulator) type, advantageously according to an entirely deserted technology also called FDSOI (Fully Depleted Silicon On Insulator).

One or several conducting zones 21, 22, 23, 24 belonging to the first level $N_1$ are also formed above transistors $T_{11}$, $T_{12}$ and can be connected to the latter. The conducting zones 21, 22, 23, 24 are for example in the form of metal lines and are arranged in at least one insulating layer 25 covering the transistors $T_{11}$, $T_{12}$.

Figure 1B:
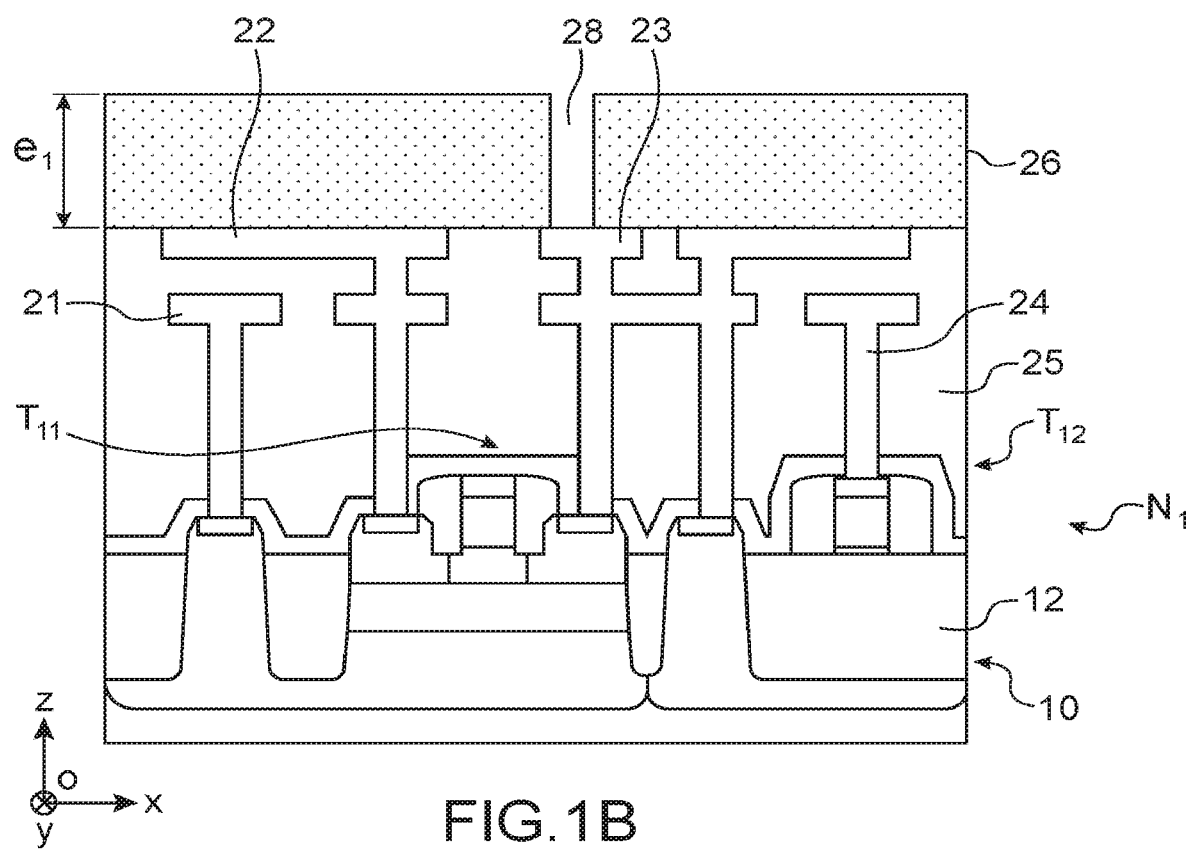

This insulating layer 25, for example with a $SiO_2$ base, and the conducting zones 21, 22, 23, 24 can be covered, as in the particular embodiment of FIG. 1B, by an insulating layer 26 of low-k or very low-k dielectric material such as for example SiOCH or SiCN. This insulating layer 26 can have a thickness $e_1$ (dimension measured parallel to the axis z of an orthogonal coordinate system [O;x;y;z]) between for example 50 nm and 120 nm.

In the insulating layer 26, a conducting element 31 is then formed, also called "via", connected to a conducting zone 23, for example in the form of a horizontal metal line that can belong to the interconnections of the first level $N_1$.

For this, a hole 28 is made, for example via photolithography then etching. The hole 28 passes through the insulating layer 26 and exposes the conducting zone 23 (FIG. 1B). A cleaning of the conducting zone at the bottom of the hole can advantageously be carried out in particular wet or using a plasma or wet and plasma combined.

Figure 1C:
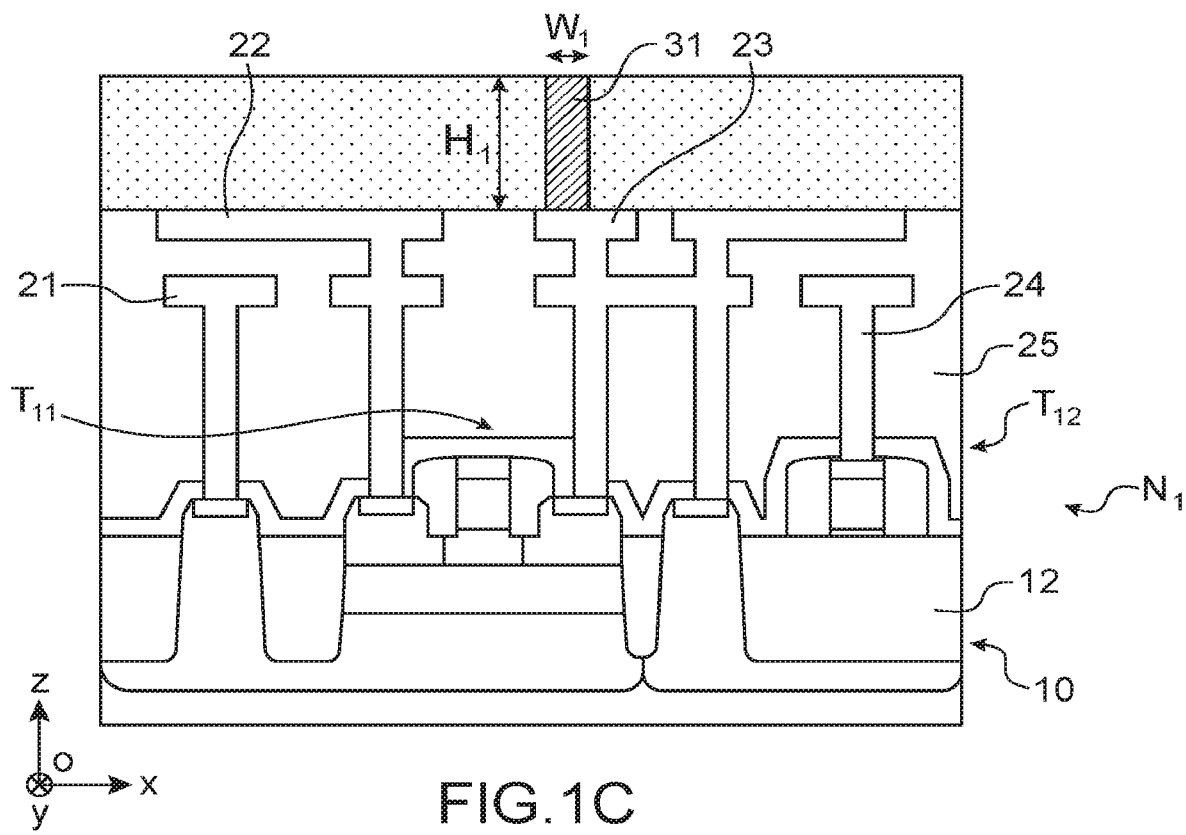

This hole 28 is then filled with one or several metal materials (FIG. 1C). It can be provided to carry out the filling first of all by carrying out the deposition of at least one thin layer (liner) of metal lining the walls and the bottom of the hole, then by completing the filling with at least one other metal deposition that fills in the hole 28. For example, a liner with a tungsten (W) base is carried out. This liner can advantageously be a layer of Ti/W provided with a Ti sublayer or comprise a material such as Ti that makes it possible to later absorb contaminants such as oxygen. The hole 28 is then filled in using another deposit of W, or according to another example, a liner of a stack of the Ti/TiN type is formed, and the hole 28 is then filled in with another metal such as W. One or several steps of CMP (chemical mechanical polishing/planarization) can then be carried out in order to remove the excess metal, in particular on the upper face of the insulating layer 26.

The conducting element 31 thus produced extends in this example in a vertical or substantially vertical direction if it is considered that a main plane of the substrate (with the main plane of the substrate being defined as a plane passing through the substrate and extending in a direction parallel to the plane [O;x;y]) is oriented in a horizontal direction.

The conducting element 31 can be provided slightly oversized in terms of width $W_1$, for example of about several nanometres (dimension parallel to the plane [O; x; y]) in relation to a conventional conductor via, this in order to favour a later realigning on its upper end. For example, the conducting element 31 can be provided with a height $H_1$ (dimension parallel to the axis z) of several tens of nanometres, for example between 50 and 120 nm.

Figure 1D:
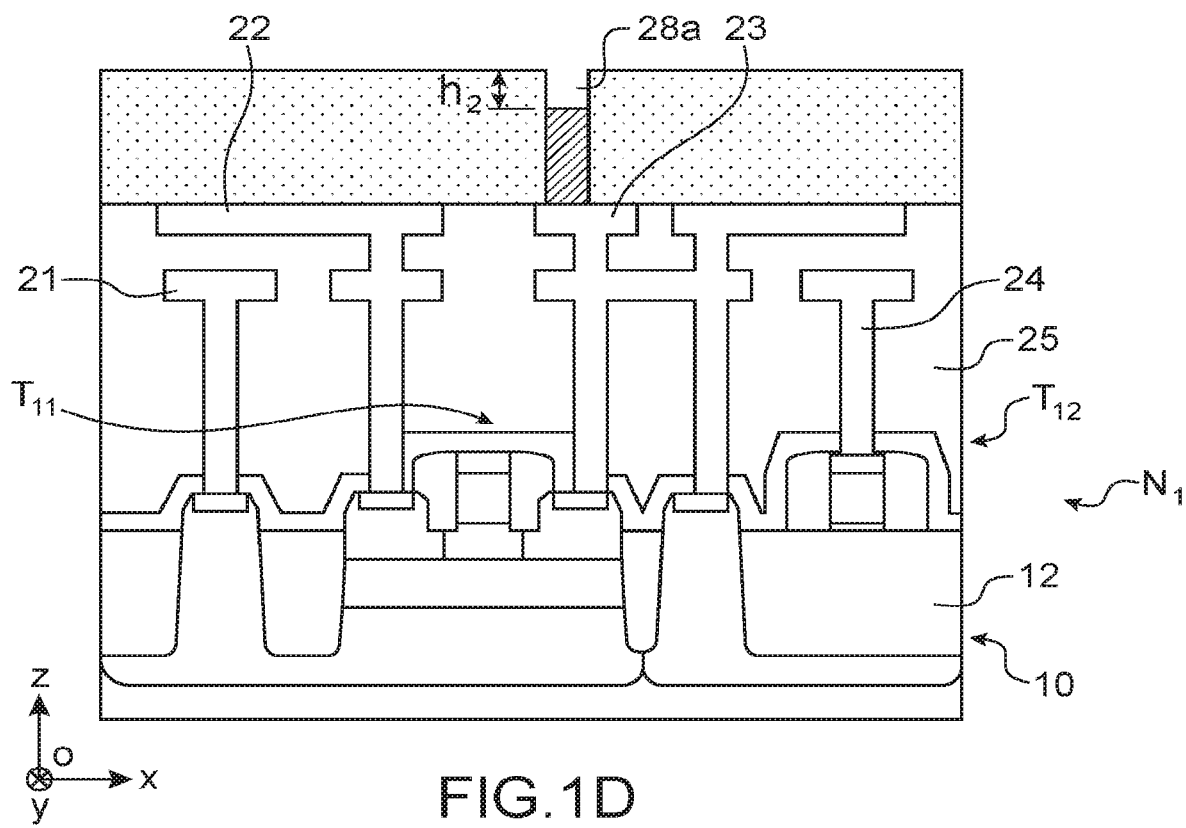

It is then possible to remove a portion of the upper end of the conducting element 31 (FIG. 1D).

It is provided in this example to replace this portion with a different metal material and in particular favourable for the forming of a metal and semi-conductor compound, in particular a silicide.

The removal is carried out for example by wet etching, typically an etching using solutions aqueous mono or multi constituent chemicals. When the element 31 is made of tungsten it is provided for example a removal using HCl or $HNO_3$ with low etching speeds that make it possible to control the removal well, the solutions $NH_4OH:H_2O_2HF:HNO_3$ or using plasma etching with as precursors $SF_6$, $CHF_3$, $N_2$. When a solution of $HF:HNO_3$ is used, the concentration of HF can be adapted so as to prevent an oxide or low-k dielectric etching.

The removal makes it possible to release a hole portion 28a. A thickness of a conducting element 31 can be removed in order to release a portion 28a of a hole of a height $h_2$ (dimension measured parallel to the axis z) between for example 1 and 20 nm.

Figure 1E:
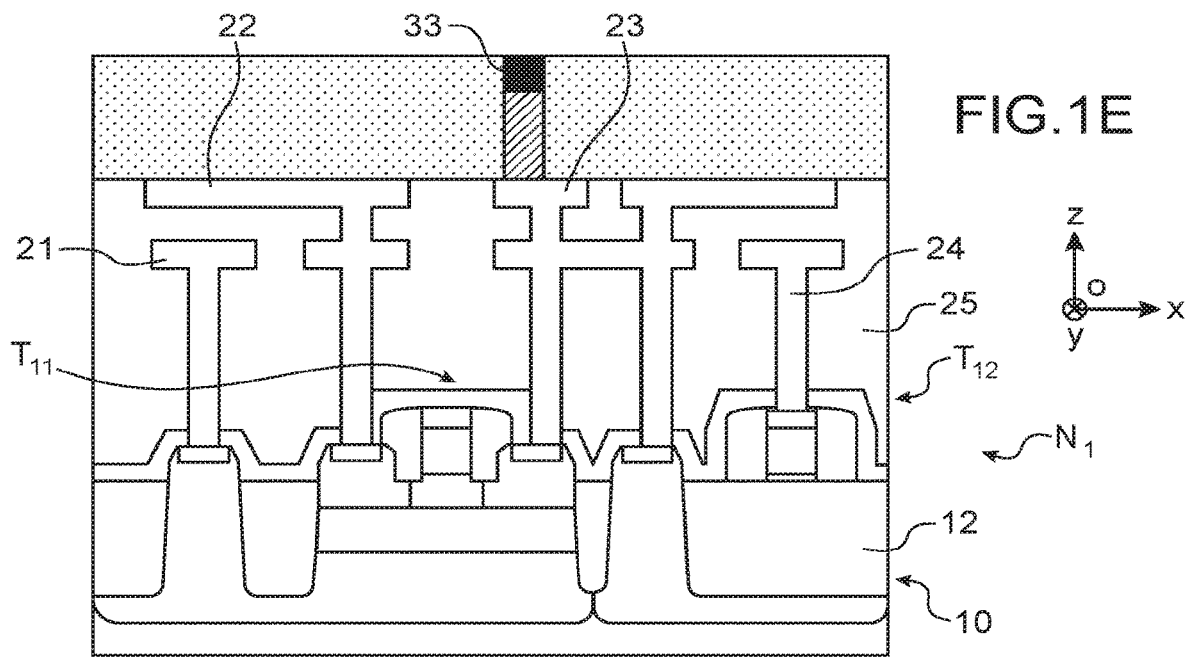

A metal material 33 for replacing, for example with a Ti or Cobalt base is then deposited in the hole portion 28a (FIG. 1E).

The metal material 33 for replacing can be formed by depositing of the CVD (Chemical Vapour Deposition) or ALD (Atomic Layer Deposition) or PVD (Physical vapour deposition) type, then followed by a step of removing excess metal material on an upper face of the insulating layer 26, for example via CMP.

A selective deposition, in other words localised on one or several exposed conducting zones, here by the hole portion 33 can also be considered, for example via a CVD, ALD technique or by a so-called "electroless" technique.

The deposition can then be followed by a step of cleaning in order to remove metal residue on the upper face of the insulating layer 26. For example a cleaning using a chemical solution such as SC1 is carried out.

An assembly is then carried out with a support provided with a semi-conductor layer 102, for example made of silicon, from which it is provided to carry out an upper level of one or several transistors. The semi-conductor layer 102 of the support wherein active zone of at least one transistor is provided can have a thickness for example between several nanometres and 20 nanometres.

Figure 1F:
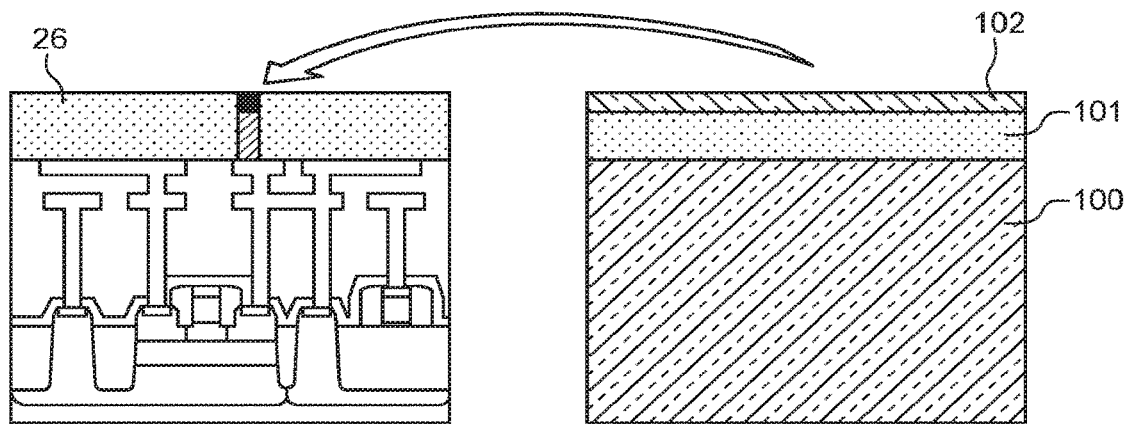

Such an assembly also called layer transfer is shown for example in FIG. 1F, and can be carried out via bonding.

The support that is bonded onto the structure that is already carried out is here formed from a layer of substrate 100 coated with an insulating layer 101, for example made of silicon oxide.

Typically, the bonding is a molecular bonding, without adding any intermediate glue. In order to favour adhesion between the layers 26 and 102, the transferring via bonding typically comprises a thermal annealing, which can be carried out for example at a temperature that can be 300° C., for a duration that can be about 2 h.

In the example shown the semi-conductor layer 102 is transferred directly on the insulating layer 26. The transferring is carried out here in such a way that an upper end of the region of metal material 33 is put into contact with a lower face of the semi-conductor layer 102.

Figure 1G:
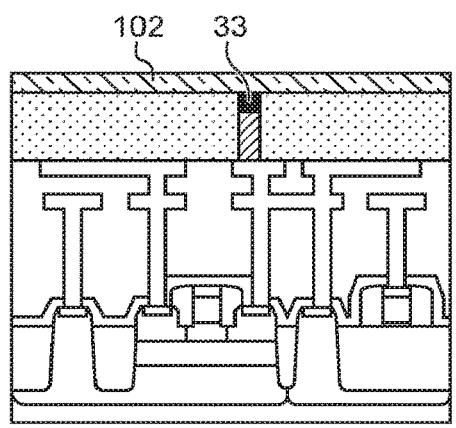

The layer of substrate 100 and the insulating layer 101 (FIG. 1G) are then removed, for example by a method comprising several steps, in particular grinding, chemical etching, mechanical polishing (CMP).

Such a transfer is particularly advantageous insofar as it makes it possible to consider a monocrystalline semi-conductor layer, and more particularly a monocrystalline silicon layer.

Figure 1H:
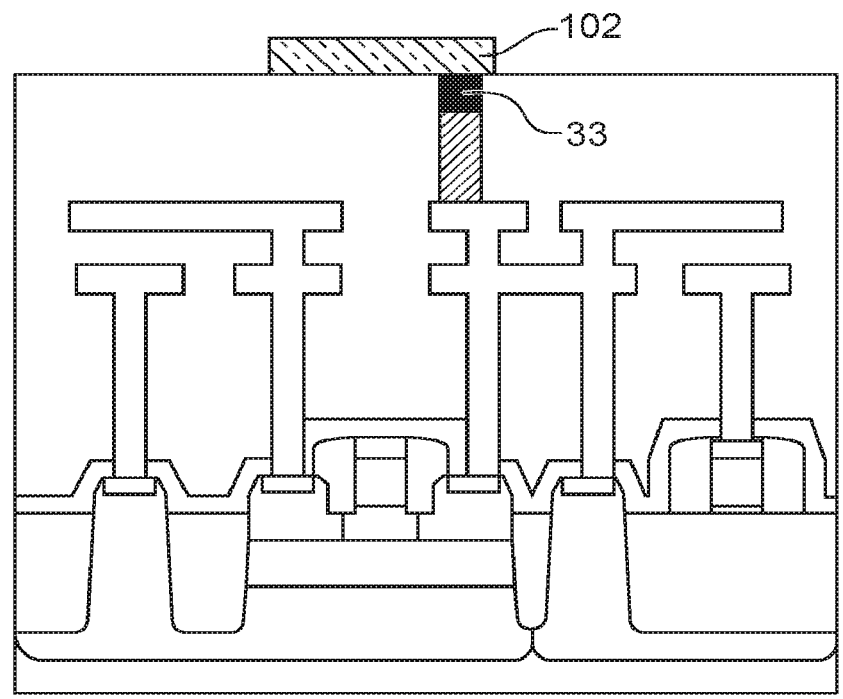

The semi-conductor layer 102 can then be etched (FIG. 1H), so as to define an active zone suitable for receiving one or several transistors.

Figure 1I:
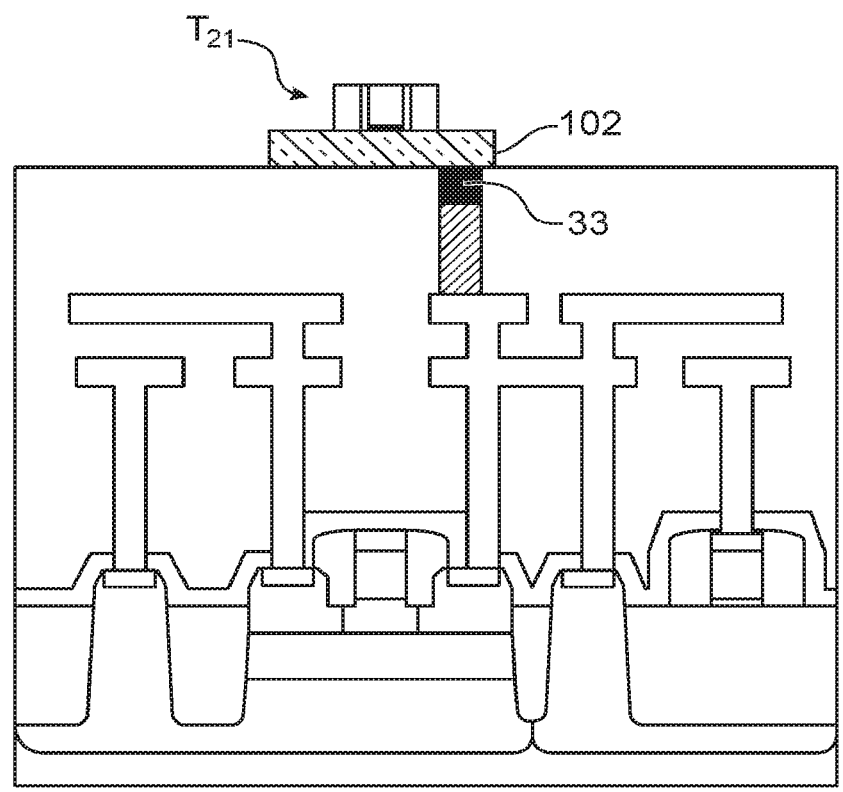

In the example of FIG. 1I, a transistor $T_{21}$ of a second level $N_2$ of the 3D stack from the semi-conductor layer 102 is formed at least partially. The transistor $T_{21}$ carried out has a channel region that extends in the semi-conductor layer 102, source and drain regions that can at least partially be formed in the semi-conductor layer 102. In this example, the transistor $T_{21}$ carried out is thus provided with a gate and a gate dielectric formed on the channel region. The carrying out of the source and drain regions can be supplemented by at least one step of epitaxial growth. A doping of the source and drain regions can be carried out at least partially during the epitaxial growth or growths, with the doping then being qualified as "in situ". An implant doping of the source and drain regions can also be provided.

Figure 1J:
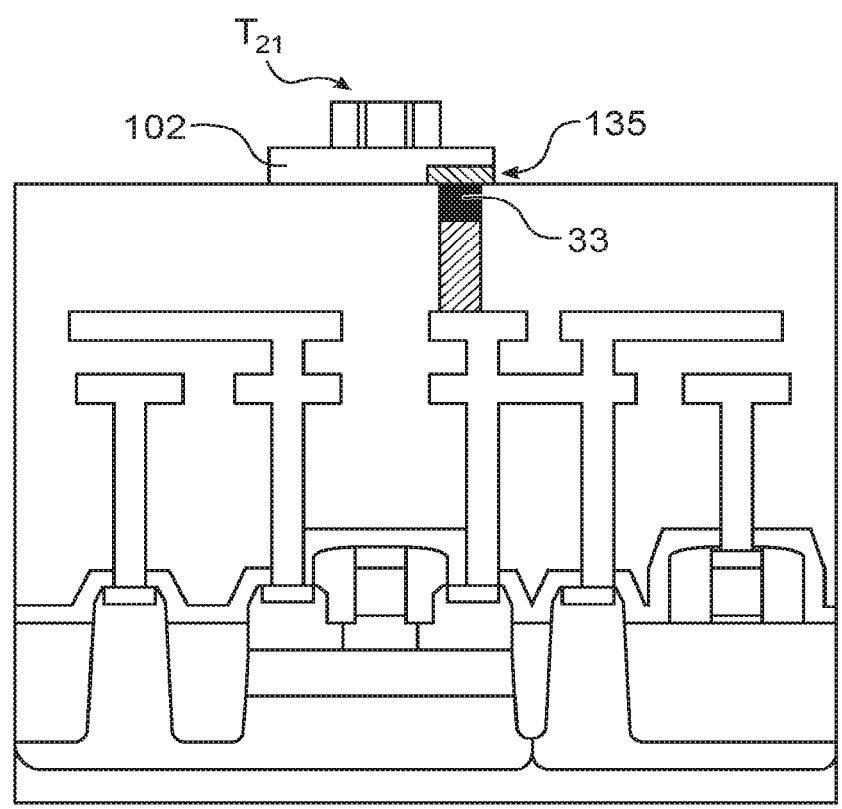

A contact zone 135 is then formed (FIG. 1J) with a metal and semi-conductor compound, in particular silicide, from the metal region 33 arranged in contact with the lower face of the active zone, in other words with the lower face of the semi-conductor layer 102.

The carrying out of this contact zone 135 comprises at least one thermal annealing that makes it possible to have the metal material of the metal region 33 react with the semi-conductor material of the semi-conductor layer 102. When for example the metal region 33 is made of cobalt and the upper semi-conductor layer 102 of silicon, the annealing is provided in such a way as to form a zone 135 of $CoSi_2$. An annealing according to a duration that can be for example between 2 min and 30 min and a temperature that can be between 400° C. and 550° C., more preferably at a temperature less than 500° C. and for a duration that can reach several hours can be implemented in order to form such a cobalt silicide $CoSi_2$.

One or more very quick thermal annealings can advantageously be carried out, typically using a laser, for example an infrared laser with a wavelength of about 832 nm, according to a duration of about 10 ms and a temperature of about 800° C.

Advantageously, a thermal annealing can be provided, in terms of duration and temperature, in such a way as to concomitantly implement the forming of the compound or of the silicide, an activation of doping agent of the source and drain regions of the transistor $T_{21}$.

The conducting element 31 and the metal region 33 form a conductor via 33, which extends under the active zone of the transistor $T_{21}$ and makes it possible to establish a connection between this active zone and the conducting zone 23 located under this active zone and here belonging to the lower level $N_1$. In order to make it possible to improve the electrical contact with the source or drain region of the transistor, the contact zone 135 made of silicide was carried out at one end of this conductor via.

As an alternative of the method described hereinabove it is also possible to implement connection structures and contact zones made of metal and semi-conductor compound associated with the type of the zone 135 for the source region as well as the drain region of the transistor $T_{21}$.

According to another alternative embodiment (FIGS. 2A-2B), it can be provided to carry out the zone 135 of metal and semi-conductor compound in contact with the lower face of the semi-conductor layer 102, concomitantly to the carrying out of another contact region 151.

This contact region 151 also with a metal and semi-conductor compound is this time located in the extension of at least one metal pad 152 provided to carry out a contact point of the side of the upper face of the semi-conductor layer 102. In other words, the metal pad 152 in question is arranged on the opposite side of the semi-conductor layer 102 to that through which the conductor via 31 was formed.

An embodiment of such an alternative, comprises the forming of at least one insulating layer 145, for example made of $SiO_2$, on the semi-conductor layer 102, and covering in particular the transistor $T_{21}$.

Figure 2A:
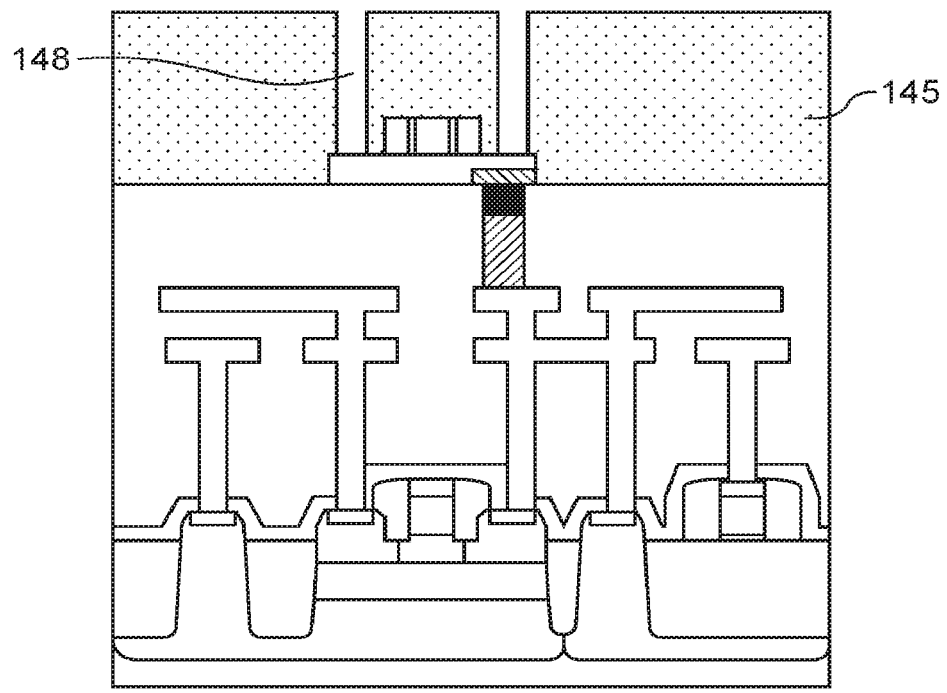
FIGS. 2A-2B are used to show an alternative embodiment wherein the carrying out of silicides with a contact zone and with a contact region are mutualised respectively with an inner via and with a connection pad of a 3D circuit transistor.

Then, one or several openings 148 are made in the insulating layer 145, respectively exposing one or several zones of the transistor $T_{21}$, typically a source region, a drain region (FIG. 2A). The gate of the transistor $T_{21}$ can also be exposed by an opening (not shown in the cross-section view of FIG. 2A) made in the insulating layer 145.

A cleaning can then be carried out wet and/or by plasma.

An optional step of plasma immersion doping of the exposed semi-conductor zone or zones can then be carried out.

One or several metals are then deposited in the openings 148 so as to form metal regions. For example, Nickel and Platinum can be deposited in order to be able to form contact regions 151 made of NiPtSi. Metal pads 152 arranged on the transistor $T_{21}$ are also carried out in the extension of these regions 151 with a metal and semi-conductor compound.

The carrying out of the regions 151 with a metal and semi-conductor compound, typically made of silicide, comprises at least one thermal annealing. This annealing is adapted in terms of duration and temperature in such a way as to form concomitantly the zone 135 of metal and semi-conductor compound under the semi-conductor layer 102. For example an annealing of the RTA (Rapid thermal anneal) type can be conducted at a temperature between 450° C. and 500° C. according to a duration between 20 s and 600 s. According to another example, it is possible to carry out a laser annealing, in particular of the LSA (Laser Surface Anneal) or DSA (Dynamic surface Anneal) type, or of the nanosecond type. This latter type of laser can have pulses of a duration of about 10 ns. The annealing can be carried out at a temperature between 500° C. and 1000° C., for example of about 800° C. for a duration that can be for example between 100 microseconds and 500 microseconds. When the annealing is carried out using a nanosecond laser, the temperature can be between 500° C. and 1000° C., for example of about 800° C. for a duration that can be for example between 10 nanoseconds and 300 nanoseconds.

Figure 2B:
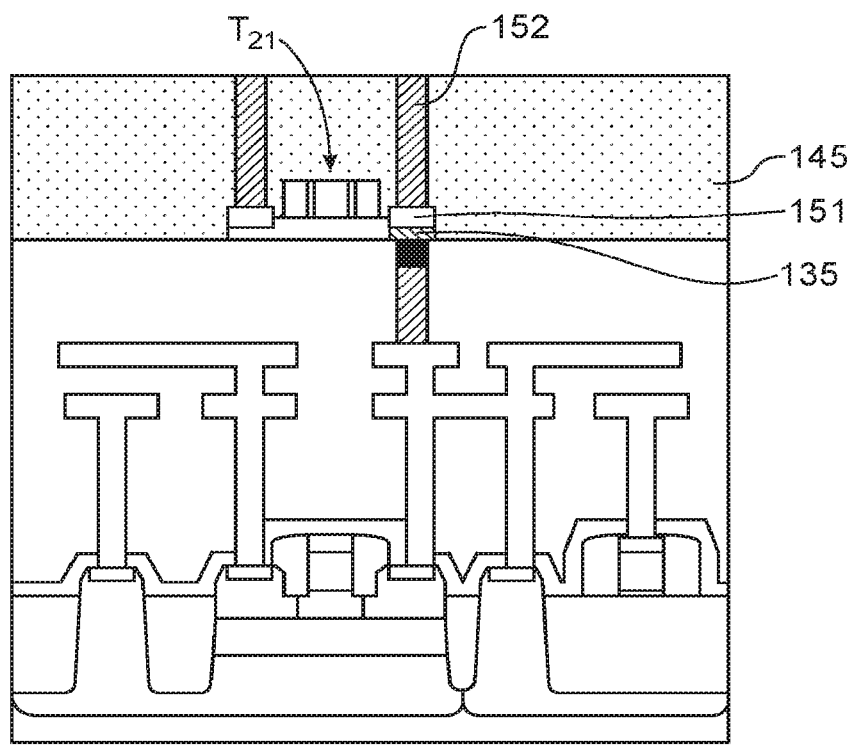

Mutualising the thermal treatments making it possible to carry out the region 151 and the zone 135, both with a metal and semi-conductor compound, this limits the propagation or diffusion of the compound or compounds to undesired regions of the semi-conductor layer 102, and in particular in the vicinity of the channel of the transistor $T_{21}$ (FIG. 2B).

In order to prevent such a propagation to the undesired zones of the semi-conductor layer 102, particular arrangement rules or designs can also be provided for the hole 28, as well as for the opening or openings 148. It is provided in particular to carry out the latter at distances (and in particular in relation to the channel) that take account of the estimations of the propagation distance of the silicide zones for a determined annealing duration.

At least one thermal annealing is then carried out which makes it possible to have the metal material of the metal region 33 react with the semi-conductor material of the semi-conductor layer 102. When for example the metal region 33 is made of cobalt and the upper semi-conductor layer 102 of silicon, the annealing is provided in such a way as to form a zone 135 of $CoSi_2$. In order to form such a cobalt silicide $CoSi_2$, an annealing of the RTA type at a temperature for example between 450° C. to 500° C. and a duration for example between 20 s and 600 s can be implemented. According to another example, a laser annealing at a temperature for example of about 800° C. for a duration between several tens of nanoseconds and several hundred microseconds can be carried out.

Figure 3A:
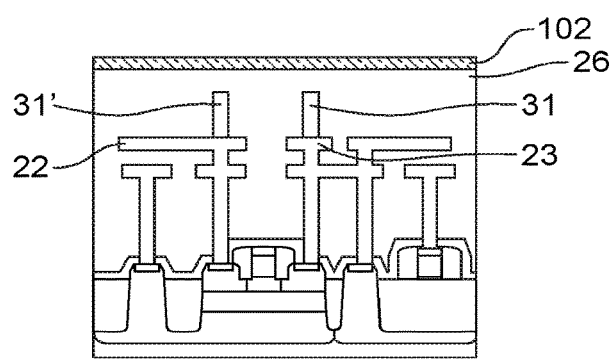
FIGS. 3A-3F are used to show an embodiment of a connection structure between a 3D circuit transistor and an underlying conducting zone, through a through via and a contact zone made of silicide formed around this via and in contact with the active zone of the upper transistor.

An alternative embodiment of the connection structure provides, as shown in FIG. 3A, to retain a thickness of an insulating layer 26 between one or several vertical conducting elements 31, 31' connected respectively to one or several conducting zones 22, 23 of the first level $N_1$ and the semi-conductor layer 102 that has just been added on this first level $N_1$.

Figure 3B:
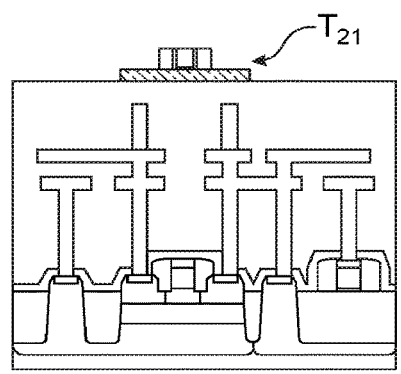

Then, once the transistor $T_{21}$ has been at least partially formed (FIG. 3B), one or several openings passing through the upper semi-conductor layer 102 are carried out.

Figure 3C:
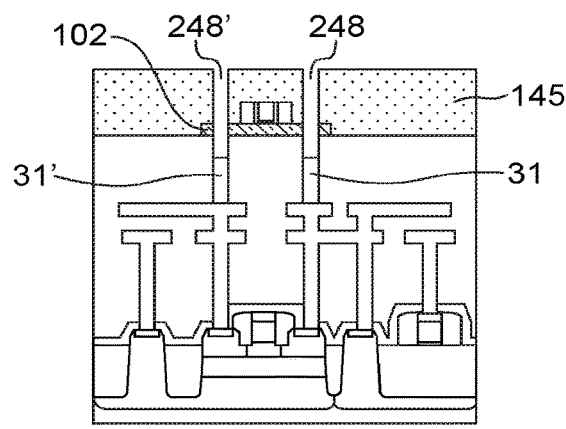

In the example shown in FIG. 3C, an insulating layer 145 is formed beforehand. Then, openings 248, 248', are made, for example via photolithography then etching, through this insulating layer 145, the semi-conductor layer 102 as well as the insulating layer 26 located under this semi-conductor layer 102. The openings 248, 248' are formed in such a way as to respectively expose the metal elements 31, 31', and in particular their upper end. In order to prevent any problem concerning alignment, the metal regions 31 and 31' can be provided with a substantial diameter at least on their upper end, this diameter able to be greater than that of the openings 248 and 248'.

The openings 248, 248' made through the semi-conductor layer 102 make it possible to expose portions of this layer 102 located in the thickness of this semi-conductor layer 102. Thus, an inner surface that extends between the upper face and the lower face opposite the semi-conductor layer 102 is exposed.

Figure 3D:
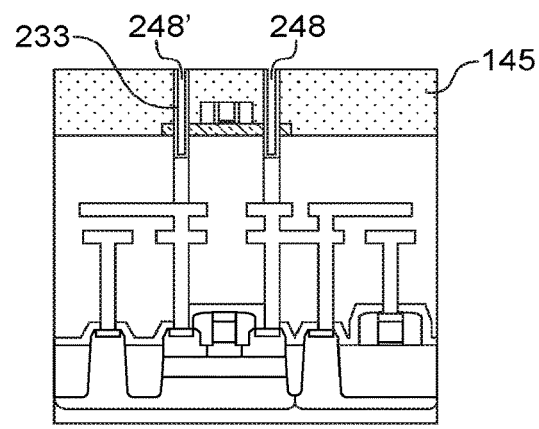

At least one metal material 233 is then deposited, in such a way as to form metal regions against the exposed portions of the semi-conductor layer 102 by the openings 248, 248' (FIG. 3D). The metal material 233 deposited can be for example with a Ti, or Ni, or Co base, or a compound of the latter or an alloy of the latter with other metals with an atomic fraction of the other metals that more preferably does not exceed 30%.

The deposition can be carried out for example by an anisotropic CVD or PVD technique. The deposition is advantageously preceded by a step of cleaning, for example using HF, in order to prevent an intermediate oxidised thickness from forming between the semi-conductor layer 102 and the metal region and which can inhibit the forming of an intermetallic compound or prevent an electrical continuity.

An optional step of doping with plasma immersion of the exposed semi-conductor zone can also precede the deposition of the metal material that makes it possible to obtain a uniform profile of doping agents and therefore to reduce the contact and access resistance.

Lateral zones 235', 235 of metal and semi-conductor compound are then carried out, in particular silicide, from the regions of metal material 233.

The producing of these zones 235', 235 of metal and semi-conductor compound, in particular silicide, comprises at least one thermal annealing.

When the metal material 233 formed in the openings 248, 248' has a Co base, and the upper semi-conductor layer 102 is made of silicon, an annealing is for example provided according to conditions of duration and temperature such as mentioned hereinabove to form a cobalt silicide $CoSi_2$.

Figure 3E:
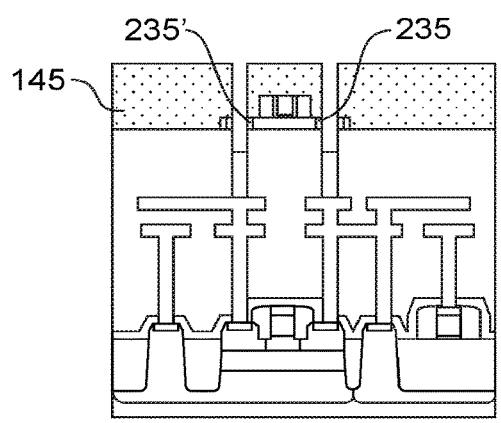

Optionally (FIG. 3E), a selective removal of metal material that did not react can then be carried out. For example, this removal is carried out using a mixture of sulphuric acid and hydrogen peroxide (SPM) or of persulphuric acid (Caro) when the metal is Ni or Co and SC1 when the latter is made of Ti.

Figure 3F:
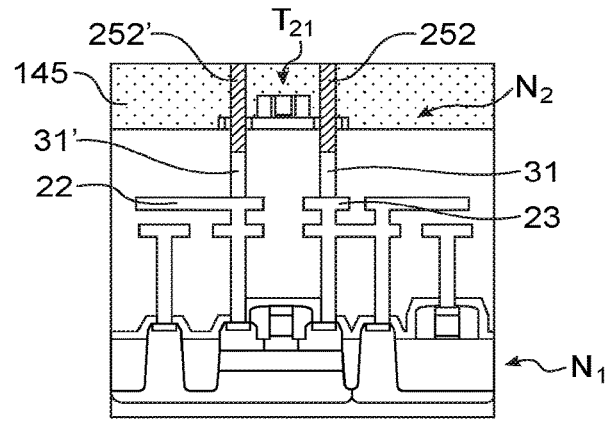

It is then possible to fill in the openings 248, 248' with at least one metal in such a way as to form metal pads 252, 252' in these openings 248, 248' (FIG. 3F). This deposition if advantageously preceded by a cleaning of the silicide zones so as to allow for optimum electrical conduction.

Several connection structures are thus carried out with each one comprising a conductor via formed from a pad 235, 235' that passes through the active zone and extends above and below the active zone, with a conducting element 31, 31' in its extension that is located between the semi-conductor layers 12, 102 of different levels $N_1$, $N_2$ and makes it possible to establish a connection with a conducting zone 22, 23 of a lower level $N_1$.

The compound zones 235, 235' of semi-conductor metal here arranged around and in contact with the metal pads 252, 252' make it possible to establish an improved electrical contact with the active zone of the transistor $T_{21}$ of upper level $N_2$ and in particular with its source and drain regions.

Figure 4:
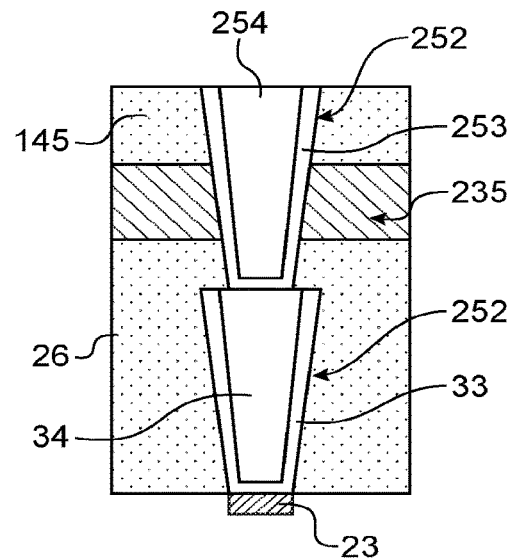
FIG. 4 is used to show a via structure passing through an active transistor zone and of a contact zone made of silicide formed around this via and in contact with the active zone of the transistor.

FIG. 4 gives an example of a particular embodiment of this through connection structure connected to a conducting zone 23 located between two superposed semi-conductor zones (not shown).

The metal pad 252 is here formed from at least one metal liner 253, for example a Ti/TiN stack, a tungsten liner or a Co or Ru liner lining the bottom and the walls of an opening wherein this pad 252 is carried out, and from a conducting material 254 for filling the central portion of the opening, typically a metal such as for example tungsten.

The metal element 31 of which an upper end is in contact with the pad 252 has in this example a similar structure and is formed from at least one thin metal layer 33 (liner), for example a Ti/TiN stack or a tungsten liner, lining the bottom and the walls of a hole wherein the metal element 31 was carried out, and with a conductor material 34 for filling the central portion of the opening, typically a metal such as for example tungsten.

An alternative of the example of the method that has just been described, provides to carry out the contact zones 235, 235' with a metal and semi-conductor compound, in particular silicide, after having formed the through metal pads. The metal material forming the casing of these pads 252, 252' is made to react in order to form the contact zones 235, 235' with a metal and semi-conductor compound.

Figure 5A:
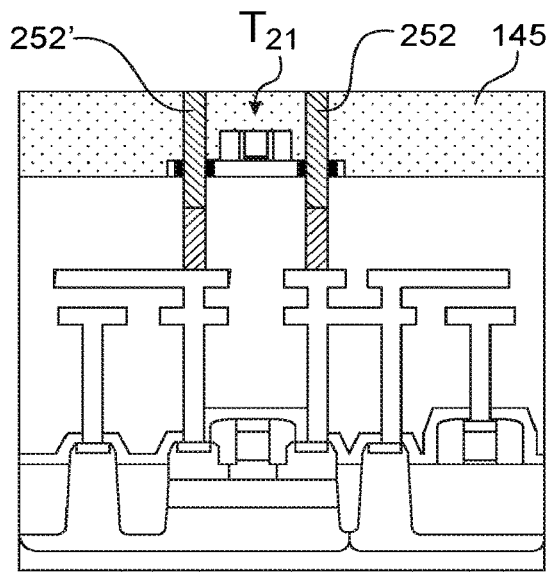
FIGS. 5A-5B are used to show an alternative embodiment wherein a lateral silicide contact zone is carried out in the thickness of the active zone by causing to react the outer metal casing of a pad passing through this active zone.
Figure 5B:
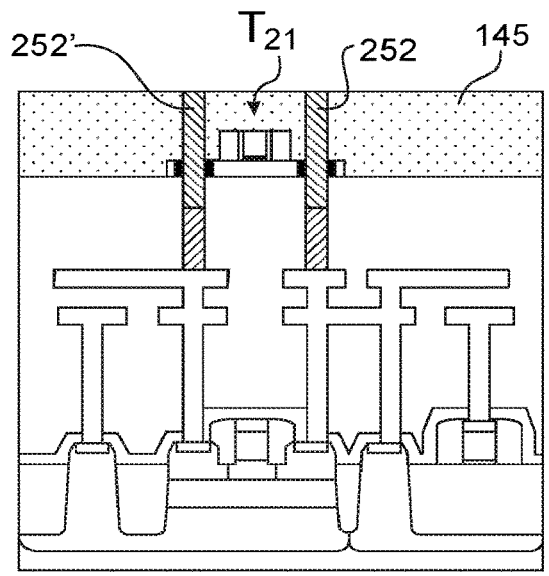

Thus, in the example shown in FIG. 5A, after having formed the insulating layer 145 that covers the transistor $T_{21}$ of upper level $N_2$, then the openings through this insulating layer 145 and the active zone of the transistor $T_{21}$ the metal pads 252 are formed in these openings.

In this example the outer casing of these pads 252, 252' is provided, made of a metal material suitable for forming a metal and semi-conductor compound, with the upper semi-conductor layer 102.

Then at least one thermal annealing is carried out that makes it possible to cause the metal material of the outer casing of these pads 252, 252' to react with the semi-conductor material of the semi-conductor layer 102 and to form the contact zones 235, 235'.

FIG. 6A gives an enlarged view of a metal pad 252 passing through the semi-conductor layer 102 before silicifying.

The metal pad 252 is here formed from an outer casing in the form of a thin metal layer 253 (liner), for example a Ti/TiN stack, and from a conducting material 254 for filling for example made of tungsten.

Then at least one silicifying thermal annealing (FIG. 6B) is carried out, which leads to a consumption of a portion of the casing and the production of a zone 235 made of silicide against the semi-conductor layer 102 and around the pad 252.

According to an alternative of one or the other of the embodiments described hereinabove (in particular those wherein the vertical metal element 31, 31' is not provided to be put into contact with the upper semi-conductor layer 102 during the adding of this layer on the lower stage) it is possible to carry out this adding by molecular gluing by using at least one intermediate layer of dielectric material.

In the embodiment of FIG. 7, the upper semi-conductor layer 102 is coated before adding with a layer of dielectric material 103, for example a low-k dielectric such as SiOCH or SiCN or SiCO. The molecular gluing is then carried out on another layer of dielectric material 27, for example made of SiOCH or SiCN or SiCO covering the lower stage in which the first level $N_1$ is carried out.

Figure 8:
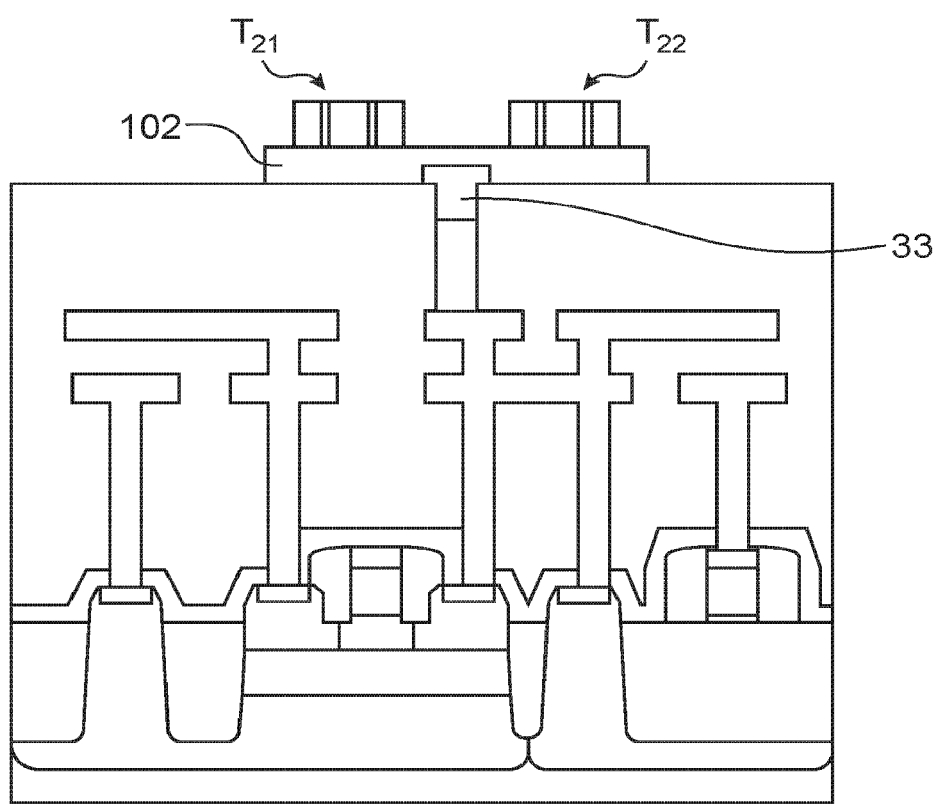
FIG. 8 is used to show an alternative embodiment wherein the contact zone made of silicide is in contact with another active zone of another transistor.
Figure 9:
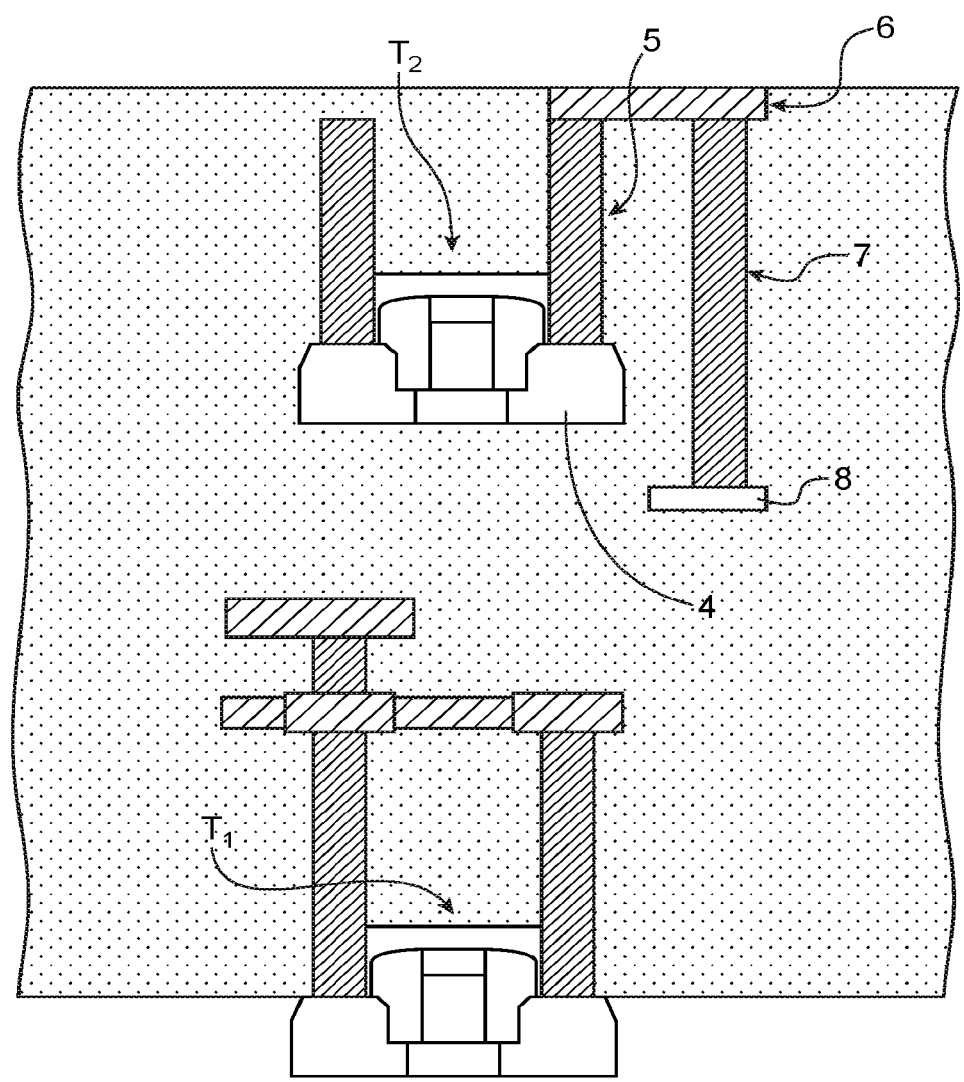
FIG. 9 is used to show a conventional connection structure in a 3D circuit.

The connection structure can also be applied to the implementing of a common contact 33 between two transistors $T_{21}$, $T_{22}$ of upper level $N_2$ formed in the upper semi-conductor layer 102, such as in the example shown in FIG. 8.

The invention claimed is:

1. A method for producing a connection structure comprising a conductor via and a contact zone with a metal and semi-conductor compound in an extension of said conductor via, the connection structure extending between an upper semi-conductor layer receiving an active zone of at least one higher level transistor of a microelectronic device comprising several levels of semi-conductor layers arranged one above the other and at least one conducting zone located under an upper level, the method comprising:
   a) supplying a lower stage provided with at least one first electronic component arranged at least partially in a lower semi-conductor layer resting on a substrate, the electronic component being surmounted by at least one insulating layer and by said conducting zone, then,
   b) transferring onto the lower stage the upper semi-conductor layer, then
   c) producing at least partially said transistor of which the active zone extends in the upper semi-conductor layer and at least one metal region in contact with the active zone,
   d) carrying out at least one thermal annealing such that a metal material of said metal region reacts with a semi-conductor material of said upper semi-conductor layer to form said contact zone, said contact zone having a metal and semi-conductor compound base and being in contact with said upper semi-conductor layer,
   said contact zone being located in the extension of a conductor via formed before and/or after the transferring, said conductor via extending under the upper semi-conductor layer and being arranged in contact with said conducting zone.

2. The method according to claim 1, wherein the producing of the conductor via comprises, prior to the step b) of transferring: the formation through the insulating layer of a conducting element in contact with said conducting zone and said metal region in the extension of this conducting element, said metal region being flush on an upper face of the insulating layer, the transferring in the step b) being carried out in such a way that said metal region is put into contact with a lower face of the upper semi-conductor layer.

3. The method according to claim 2, wherein the formation of the conducting element and of said metal region in its extension comprises steps of:
   forming the conducting element passing through the insulating layer,
   removing an upper portion of the conducting element, in such a way as to release a hole in the insulating layer, filling said hole with at least one metal material is such a way as to produce said metal region.

4. The method according to claim 3, wherein the producing of the conductor via comprises, after the step b) of adding, steps of
   forming of at least one opening passing through the upper semi-conductor layer,
   depositing of metal material in said opening in such a way as to form the metal region.

5. The method according to claim 4, wherein the producing of the conductor via comprises, prior to the step b) of transferring: the formation through the insulating layer of a conducting element in contact with said conducting zone then with said metal region in the extension of this conducting element, and wherein the adding in the step b) is carried out in such a way that an insulating thickness is retained above an upper end of said conducting element, said opening passing through the upper semi-conductor layer being formed in such a way as to furthermore pass through said insulating thickness and to expose said upper end of said conducting element.

6. The method according to claim 5, wherein at the step b) of transferring, the upper semi-conductor layer is coated with a first layer of dielectric material, and wherein said lower stage is coated with a second layer of dielectric material, the transferring being carried out by molecular bonding of the first layer of dielectric material on the second layer of dielectric material.

7. The method according to claim 4, wherein the producing of the conductor via further comprises, after the production of said opening and the step d) of forming said contact zone with a metal and semi-conductor compound, the forming of a metal pad in said opening.

8. The method according to claim 4, the producing of the conductor via comprises after the production of said opening, the production of a metal pad in this opening, said metal region being a region of said metal pad in contact with the upper semi-conductor layer.

9. The method according to claim 4, wherein after the forming of said opening passing through the upper semi-conductor layer or of said hole in the insulating layer, a cleaning is carried out in said opening or in said hole prior to the depositing or the filling with metal material.

10. The method according to claim 1, wherein prior to the step d), at least one metal zone is further formed on an upper face of the upper semi-conductor layer, the annealing carried out in the step d) being carried out in such a way as to form concomitantly with the forming of said contact zone with a metal and semi-conductor compound, a compound region of metal and semi-conductor in the extension of said metal zone.

11. The method according to claim 1, wherein source and drain regions of said transistor are doped in the step c), with the thermal annealing in the step d) being provided in such a way as to carry out an activation of doping agents of the source and drain regions.

12. The method according to claim 1, wherein the thermal annealing carried out in the step d) is a laser annealing.

13. The method according to claim 1, wherein said metal region is in contact with another active zone of another transistor, in such a way that said contact zone formed in the step d) with said metal and semi-conductor compound base is in contact with said other active zone.

14. The method according to claim 1, wherein the semi-conductor layer is made of silicon and wherein the metal region has a cobalt and/or Ti and/or Ni base.

15. A method for producing a connection structure comprising a conductor via and a contact zone with a metal and semi-conductor compound in an extension of said conductor via, the connection structure extending between an upper monocrystalline semi-conductor layer receiving an active zone of at least one higher level transistor of a microelectronic device comprising several levels of semi-conductor layers arranged one above the other and at least one conducting zone located under an upper level, the method comprising:
- a) supplying a lower stage provided with at least one first electronic component arranged at least partially in a lower semi-conductor layer resting on a substrate, the electronic component being surmounted by at least one insulating layer and by said conducting zone, then,
- b) transferring onto the lower stage the upper monocrystalline semi-conductor layer, on an upper face of the at least one insulating layer, then
- c) producing at least partially said transistor of which the active zone extends in the upper monocrystalline semi-conductor layer and at least one metal region in contact with the active zone,
- d) carrying out at least one thermal annealing such that a metal material of said metal region reacts with a semi-conductor material of said upper monocrystalline semi-conductor layer to form said contact zone, said contact zone having a metal and semi-conductor compound base and being in contact with said monocrystalline upper semi-conductor layer, said contact zone being located in the extension of a conductor via formed before the transferring, said conductor via extending under the upper monocrystalline semi-conductor layer and being arranged in contact with said conducting zone.

16. The method according to claim 15, wherein the producing of the conductor via comprises: the formation through the insulating layer of a conducting element in contact with said conducting zone and said metal region in the extension of this conducting element, said metal region being flush on an upper face of the insulating layer, the transferring in the step b) being carried out in such a way that said metal region is put into contact with a lower face of the upper monocrystalline semi-conductor layer.

17. The method according to claim 16, wherein the formation of the conducting element and of said metal region in its extension comprises steps of:
- forming the conducting element passing through the insulating layer,
- removing an upper portion of the conducting element, in such a way as to release a hole in the insulating layer,
- filling said hole with at least one metal material is such a way as to produce said metal region.

18. A method for producing a connection structure comprising a conductor via and a contact zone with a metal and semi-conductor compound in an extension of said conductor via, the connection structure extending between an upper monocrystalline semi-conductor layer receiving an active zone of at least one higher level transistor of a microelectronic device comprising several levels of semi-conductor layers arranged one above the other and at least one conducting zone located under an upper level, the method comprising:
- a) supplying a lower stage provided with at least one first electronic component arranged at least partially in a lower semi-conductor layer resting on a substrate, the electronic component being surmounted by at least one insulating layer and by said conducting zone, then,
- b) transferring onto the lower stage the upper monocrystalline semi-conductor layer on an upper face of the at least one insulating layer, then
- c) producing at least partially said transistor of which the active zone extends in the upper monocrystalline semi-conductor layer and at least one metal region in contact with the active zone,
- d) carrying out at least one thermal annealing such that a metal material of said metal region reacts with a monocrystalline semi-conductor material of said upper semi-conductor layer to form said contact zone, said contact zone having a metal and semi-conductor compound base and being in contact with said upper monocrystalline semi-conductor layer, said contact zone being located in the extension of a conductor via formed after the transferring, said conductor via extending under the upper monocrystalline semi-conductor layer and being arranged in contact with said conducting zone.

19. The method according to claim 18, wherein the producing of the conductor via comprises, steps of:
- forming of at least one opening passing through the upper monocrystalline semi-conductor layer,
- depositing of metal material in said opening in such a way as to form the metal region.

20. The method according to claim 19, wherein the producing of the conductor via comprises, prior to the step b) of transferring: the formation through the insulating layer of a conducting element in contact with said conducting zone then with said metal region in the extension of this conducting element, and wherein the adding in the step b) is carried out in such a way that an insulating thickness is retained above an upper end of said conducting element, said opening passing through the upper monocrystalline semi-conductor layer being formed in such a way as to furthermore pass through said insulating thickness and to expose said upper end of said conducting element.

* * * * *